(12) United States Patent
Hein et al.

(10) Patent No.: US 6,928,025 B1
(45) Date of Patent: Aug. 9, 2005

(54) SYNCHRONOUS INTEGRATED MEMORY

(75) Inventors: Thomas Hein, München (DE); Thilo Marx, München (DE); Patrick Heyne, München (DE); Torsten Partsch, München (DE)

(73) Assignee: Infineon Technologies AG, Munich (DE)

( * ) Notice: Subject to any disclaimer, the term of this patent is extended or adjusted under 35 U.S.C. 154(b) by 82 days.

(21) Appl. No.: 09/621,905

(22) Filed: Jul. 24, 2000

(30) Foreign Application Priority Data

Jul. 22, 1999 (DE) .............................. 199 34 501

(51) Int. Cl.$^7$ ................................................ G11C 8/00
(52) U.S. Cl. ........................ 365/233; 365/194; 365/236
(58) Field of Search ................. 365/233, 194, 365/236, 230.06, 189.07, 191

(56) References Cited

U.S. PATENT DOCUMENTS 5,796,673 A    8/1998  Foss et al.
5,946,244 A *  8/1999  Manning .................... 365/194
6,137,328 A * 10/2000  Sung ......................... 327/158
6,335,901 B1 * 1/2002  Morita et al. ............... 365/233
6,441,659 B1 * 8/2002  Demone ..................... 327/156

\* cited by examiner

*Primary Examiner*—Gene N. Auduong
(74) *Attorney, Agent, or Firm*—Laurence A. Greenberg; Werner H. Stemer; Ralph E. Locher

(57) ABSTRACT

An output circuit (OUT) can be activated via an activation input (AKT), in the activated state starts an output process for data (D) to be read out, in synchronism with the first internal clock (CLKI1), and outputs the data (D) with a specific phase shift (ΔTOUT) with respect to the first internal clock (CLKI1), in synchronism with the external clock (CLKE), at a data connection (P). A counting unit (CT) starts a counting process for recording the number of successively following first levels of the first internal clock (CLKI1) as soon as a second internal clock (CLKI2), which is synchronized to the external clock (CLKE), for the first time assumes a first level while an output control signal (PAR) is at first level. It activates the output circuit (OUT) as soon as the number of successively following first levels of the first internal clock (CLKI1) has reached a predetermined value.

5 Claims, 3 Drawing Sheets

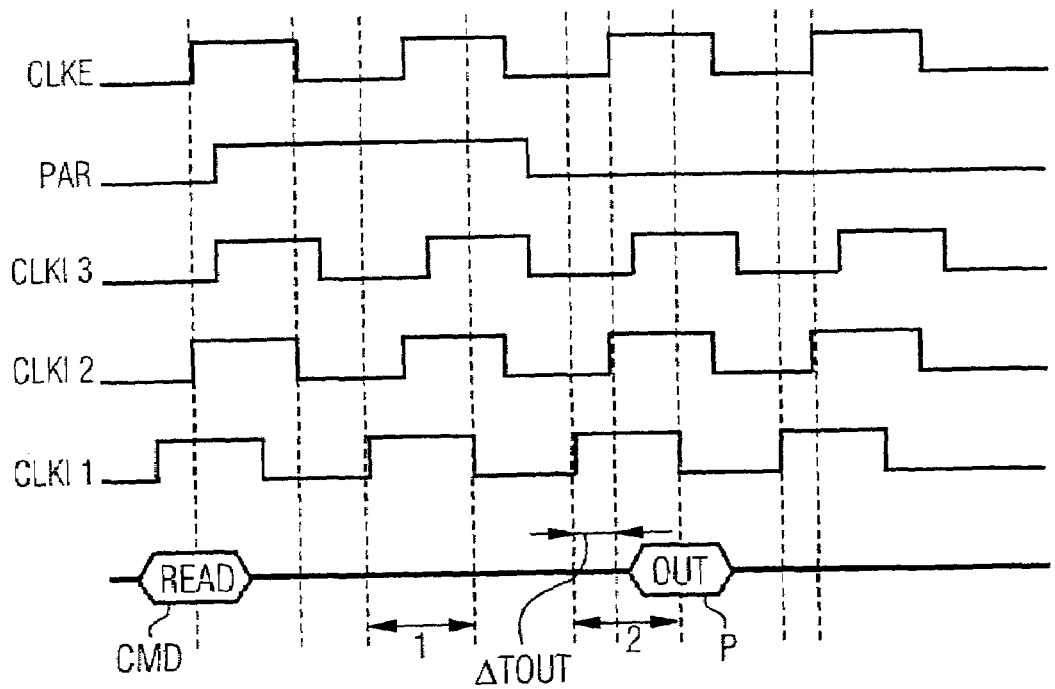
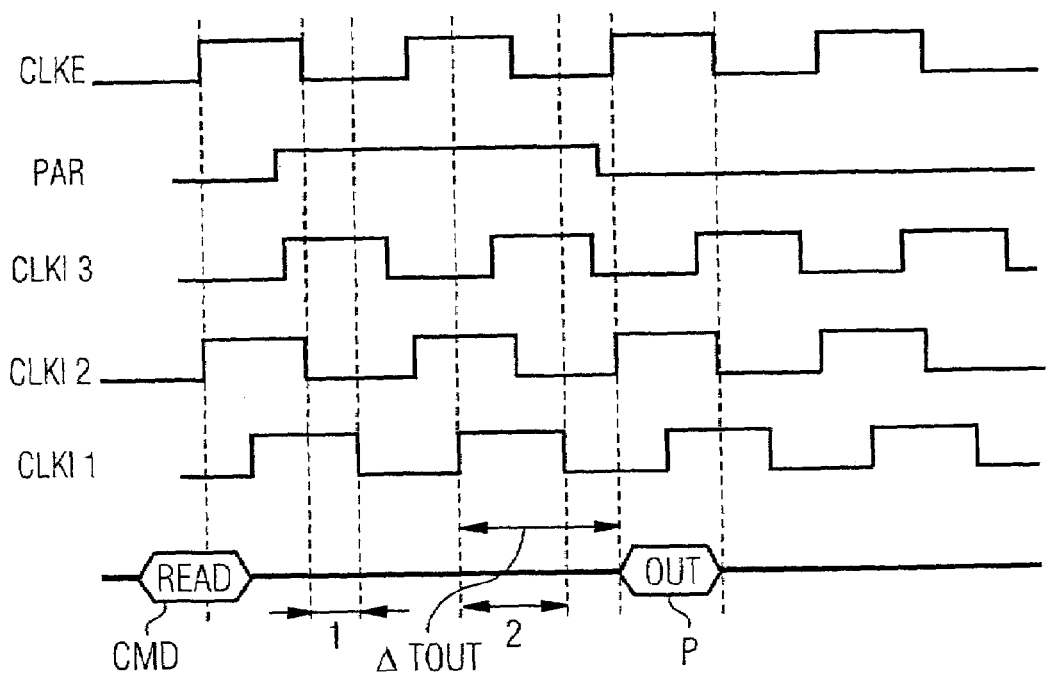

SYNCHRONOUS INTEGRATED MEMORY

BACKGROUND OF THE INVENTION

Field of the Invention

The invention is based on the object of specifying a synchronous integrated memory of said type, in which data to be read out are output at a data connection after a predetermined number of clock cycles of an external clock, once an output control signal has indicated the start of a read-out process.

SUMMARY OF THE INVENTION

This object is achieved by a synchronous integrated memory having a control unit for producing a first internal clock, which leads the external clock by a specific phase shift, an output circuit, which can be activated via an activation input, which, in the activated state, starts an output process for the data to be read out, in synchronism with the first internal clock, and which outputs the data with the specific phase shift with respect to the first internal clock, that is to say in synchronism with the external clock, at the data connection, a clock generator for a second internal clock, which is synchronized to the external clock, a counting unit, which starts a counting process for recording the number of successively following first levels of the first internal clock as soon as the second internal clock for the first time assumes a first level while an output control signal is at a first level, and which activates the output circuit via its activation input as soon as the number of successively following first levels of the first internal clock has reached a predetermined value. Advantageous refinements and developments of the invention are the subject matter of the dependent claims.

The memory according to the invention has a control unit for producing a first internal clock, which leads the external clock by a specific phase shift. Furthermore, it has an output circuit which can be activated via an activation signal and which, in the activated state, starts an output process for the data to be read out, in synchronism with the first internal clock, and which outputs the data with the specific phase shift with respect to the first internal clock, that is to say in synchronism with the external clock, at the data connection. Furthermore, it has a clock generator for producing a second internal clock, which is synchronized to the external clock. The memory also has a counting unit, which starts a counting process for recording the number of successively following first levels of the first internal clock as soon as the second internal clock for the first time assumes a first level while an output control signal is at a first level, and which activates the output circuit via the activation signal as soon as the number of successively following first levels of the first internal clock has reached a predetermined value.

The invention ensures that the data at the data connection are output delayed by the predetermined number of clock cycles of the external clock after the occurrence of the first level of the output control signal, since the first internal clock, whose first levels are counted by the counting unit, differs from the external clock only by the specific phase shift.

According to one development of the invention, the counting unit is supplied with a variable control signal via which different predetermined values can be set for the number of successively following first levels of the first internal clock. This allows the data which are to be read out to be output with adjustable latency.

According to one development of the invention, the counting unit has a shift register with a series circuit of register elements. One input of the first register element of the series circuit is supplied with the output control signal.

The first register element has a clock input to which the second internal clock is supplied, and the other register elements have clock inputs to which the first internal clock is supplied. Furthermore, the memory has a multiplexer via which the outputs of at least some of the register elements are connected to the activation input of the output circuit and whose switching state can be set via the control signal.

Since the register elements of the shift register operate in synchronism with the first internal clock, the multiplexer output signal which is supplied to the activation input of the output circuit is likewise synchronized to the first clock, by means of which the output process for the data to be read out is also started by the output circuit. The start of the output process, which is possible only when the output circuit is activated, thus takes place without any delay, synchronized to the first internal clock.

According to one development of the invention, the clock generator produces the second internal clock from the first internal clock, by means of a delay element. This can be done without any problems since the first internal clock leads the external clock by the specific phase shift.

According to one development of the invention, the control unit of the memory has an input which is connected to the external clock and an output to which the input is connected via a variable delay unit and at which it produces the first internal clock. Furthermore, the control unit has a phase comparator with a first input which is connected to the input of the control unit, with a second input to which the output of the control unit is connected via the delay element of the clock generator, and with an output which is connected to a control input of the delay unit. In this development, the control unit is thus a Delay Locked Loop, in whose feedback path the delay element is arranged, and this delay element carries out two functions at the same time: firstly the setting of the specific phase shift between the first internal clock and the external clock. Secondly the generation of the second internal clock from the first internal clock. This double function of the delay element allows the memory to be constructed with fewer components than if the clock generator were to be constructed with components provided in addition to the components of the control unit.

The invention will be explained in more detail in the following text with reference to the figures, in which:

BRIEF DESCRIPTION OF THE DRAWINGS

FIGS. 3 and 4 show various examples of signal profiles for the exemplary embodiment shown in FIGS. 1 and 2.

DESCRIPTION OF THE PREFERRED EMBODIMENT

Figure 1:
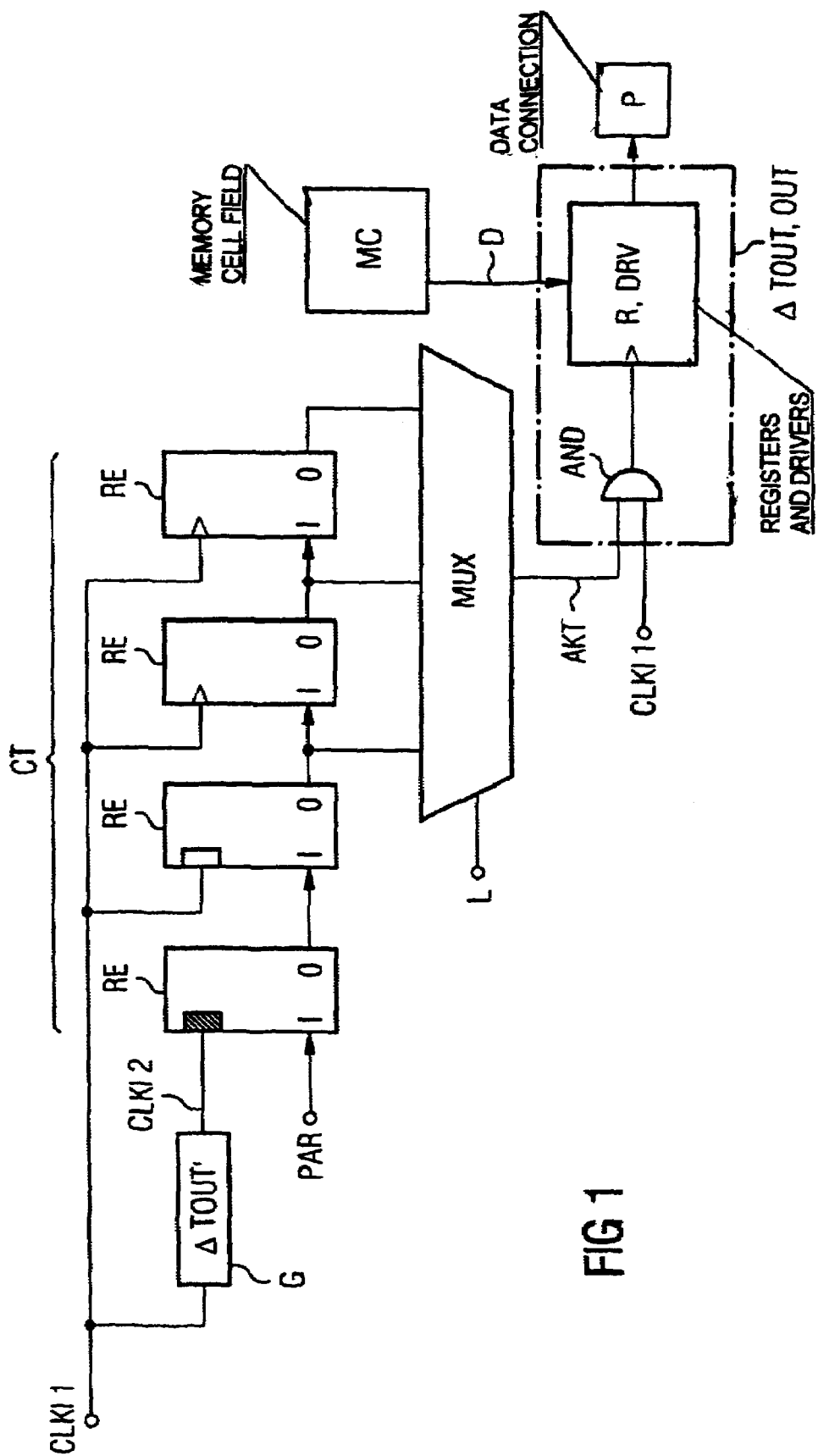
FIG. 1 shows an output circuit and a counting unit of one exemplary embodiment of the synchronous memory.

The synchronous memory shown by way of example here is a synchronous DRAM. FIG. 1 shows a memory cell field MC of the memory, from which data D to be read out are output via an output circuit OUT to a data connection P. The output circuit has registers R and drivers DRV, which are not shown in any more detail. Furthermore, it has an AND gate AND, whose first input is a clock input for a first internal clock CLKI1, and whose second input is an activation input AKT. The output of the data D to be read out, by the output circuit OUT, depends on the output signal of the AND gate AND. In this case, the output circuit OUT has a delay ΔTOUT between the occurrence of a positive edge (which activates the output circuit) of the first internal clock CLKI1 at the first input of the AND gate AND with a high level at the same time at the activation input AKT, and the time at which a data item D to be read out is present at the data connection P.

According to FIG. 1, the memory has a counting unit CT which comprises a shift register with register elements RE. By way of example, four register elements RE are shown, but this number may also assume other values in other exemplary embodiments of the invention.

One input I of each register element RE is connected to an output O of the preceding register element. The input I of the first register element RE of the series circuit is connected to an internal output control signal PAR, which is derived from an external read command which is supplied to the memory. Each register element RE has a clock input, with the clock input of the first register element being negative-level sensitive, the clock input of the second register element being positive-level sensitive, and the clock inputs of the other register elements being positive-edge sensitive. The clock input of the first register element RE is supplied with a second internal clock signal CLKI2, which is synchronized to an external clock CLKE which is supplied to the memory. The clock input of the first register element RE reacts to negative levels of the second internal clock CLKI2. The clock inputs of the other register elements RE are supplied with the first internal clock CLKI1.

According to FIG. 1, the memory also has a clock generator G, which produces the second internal clock CLKI2 from the first internal clock CLKI1. This is done by means of a delay element, which has a delay time ΔTOUT', which corresponds as exactly as possible to the delay ΔTOUT of the output circuit.

The outputs O of the register elements RE, with the exception of the first register element, are connected via a multiplexer MUX to the second input of the AND gate AND. A control signal L which is supplied to the multiplexer MUX can be used to choose the register element output to which the activation input AKT of the output circuit OUT is conductively connected.

Figure 2:
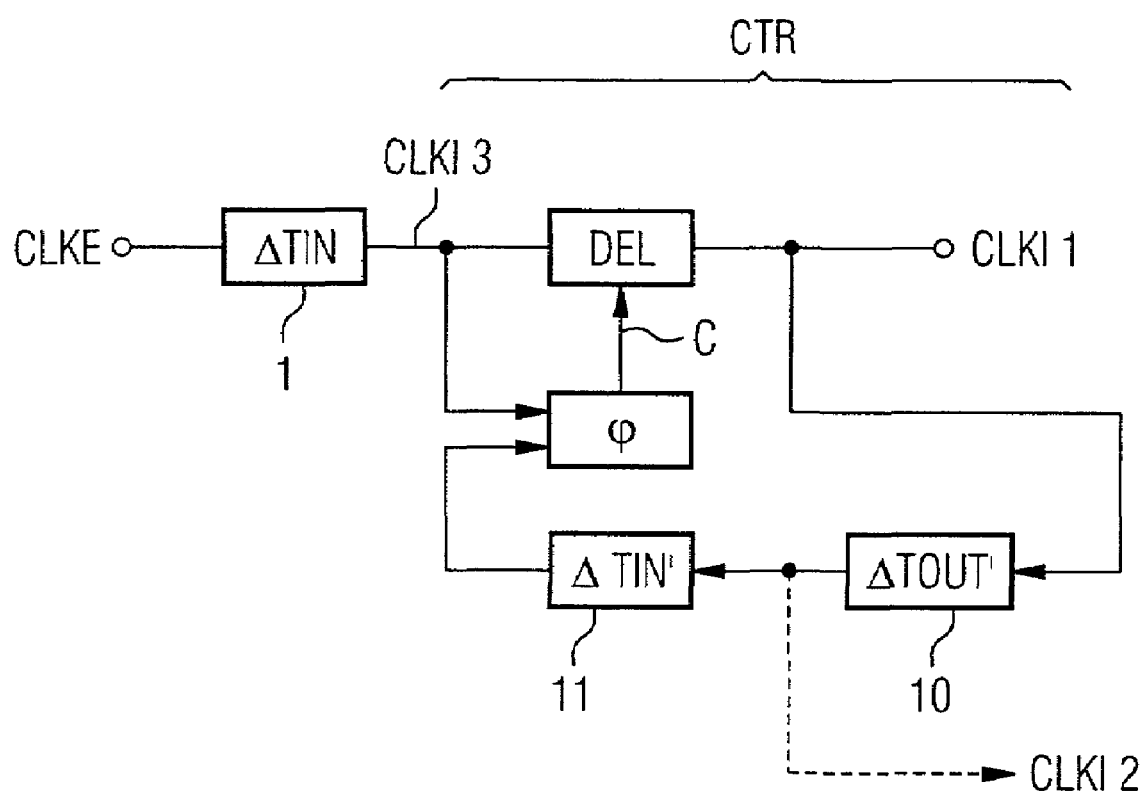
FIG. 2 shows a control unit of the synchronous memory.

FIG. 2 shows a control unit of the memory according to the invention in the form of a Delay Locked Loop (DLL), by means of which the first internal clock CLKI1 is produced from the external clock CLKE. The control unit CTR has an input to which the external clock CLKE is supplied, delayed by an input delay ΔTIN (which is caused by corresponding input circuits 1 of the memory), as a third internal clock CLKI3. The input of the control unit CTR is connected via a variable delay unit DEL to the control unit output, at which it produces the first internal clock CLKI1. Furthermore, the control unit CTR has a phase comparator φ, whose first input is connected to the input of the control unit CTR and which has a second input, to which the output of the control unit CTR is connected via two delay elements 10, 11. The first delay element 10 has a delay time ΔTOUT', which corresponds as exactly as possible to the delay time ΔTOUT of the output circuit OUT in FIG. 1. The second delay element 11 has a delay time ΔTIN', which corresponds as exactly as possible to the delay time ΔTIN of the input circuit 1. A control output C of the phase comparator φ is connected to a control input of the variable delay unit DEL, via which its delay time is set.

The first internal clock CLKI1, which is produced by the control unit CTR in FIG. 2, leads the third internal clock CLKI3 by the sum of the delay times ΔTOUT', ΔTIN' of the delay elements 10, 11. Since the delay time ΔTIN' of the second delay element 11 corresponds to the delay time ΔTIN of the input circuit 1, the first internal clock CLKI1 thus leads the external clock CLKE by the delay time ΔTOUT' of the first delay element 10.

FIG. 2 shows a further exemplary embodiment of the invention, indicated by the dashed arrow, in which the output signal of the first delay element 10 is used as the second internal clock CLKI2. In this case, the first delay element 10 is a component of the clock generator G and is identical to the delay element shown in FIG. 1. In the exemplary embodiment being considered here, the delay element of the clock generator G in FIG. 1 is, however, present in addition to the first delay element 10 of the control unit CTR.

Since the second internal clock CLKI2 is produced from the first internal clock CLKI1 by the clock generator G with a positive phase shift of ΔTOUT', it is synchronized to the external clock CLKE. In this case, "synchronized" means that the two clocks have virtually no phase shift with respect to one another.

FIGS. 3 and 4 show various examples of signal profiles of the external clock CLKE, of the output control signal PAR, of the internal clocks CLKI1, CLKI2, CLKI3 and of the data output at the data connection P. FIGS. 3 and 4 show signal profiles for various frequencies of the clock signals with a constant delay time ΔTOUT from the output circuit OUT. The scales in FIGS. 3 and 4 thus differ. It can be seen that the second internal clock CLKI2 is synchronized to the external clock CLKE, and the first internal clock CLKI1 leads the external clock CLKE by the delay time TOUT of the output circuit OUT. The output control signal PAR is synchronized to the third clock signal CLKI3 at the input of the control unit CTR from FIG. 2.

For the signal profiles illustrated in FIGS. 3 and 4, the multiplexer MUX from FIG. 1 is actuated via the control signal L such that it connects the output O of the penultimate register element RE to the activation input AKT of the output circuit OUT. This means that the memory has a latency of 2. This can best be explained with reference to the last line in FIGS. 3 and 4: once an external read command CMD, which is supplied to the memory, has occurred, two and only two clock periods of the external clock CLKE must follow before the data to be output are actually present at the data connection P. This is indicated by the double arrows denoted by the numbers 1 and 2 in FIGS. 3 and 4.

The counting unit CT shown in FIG. 1 ensures that the latency is maintained, in the following way: as soon as the output control signal PAR, which is derived from the external read command CMD, becomes active at a high level, it starts a counting process as soon as the second internal clock CLKI2 is at a negative level. The contents of the register elements RE are all set to zero in advance. The "one" (which is thus stored by the first register element RE) in the output control signal PAR is then accepted by the second register element RE as soon as the first internal clock CLKI1 is at a high level.

The subsequent register element RE each accept this "one" when a subsequent positive edge serves on the first internal clock CLKI1.

Thus, as soon as the output control signal PAR assumes a positive level and provided the second internal clock CLKI2 is at a low level, the counting unit CT from FIG. 1 thus counts the subsequent positive levels of the first internal clock CLKI1. In this case, the output signal of the counting unit CT is synchronized to the first internal clock CLKI1, since the register elements RE are clocked by it.

We claim:

1. A synchronous integrated memory for holding data and to be connected to an external clock producing an external clock signal, the memory comprising:
   a data connection;
   an output control connection carrying an output control signal having output levels including a given level;
   a control unit outputting a first internal clock signal to lead an external clock signal by a given phase shift, said first internal clock signal having first signal levels including said given level;
   a clock generator generating a second internal clock signal synchronized to the external clock signal and having second levels including said given level;
   a counting unit having an activation connection carrying an activation signal defining an activated state;
   said counting unit starting a counting process for recording a number of successively following given levels of said first internal clock signal as soon as said second internal clock signal for a first time assumes said given level while said output control signal is at said given level,
   an output circuit connected to said activation connection, said activated state starting an output process for reading data out of the memory in synchronism with said first internal clock signal;
   said output circuit outputting the data at said data connection with said given phase shift with respect to said first internal clock signal and in synchronism with the external clock signal; and
   said counting unit activating said output circuit through said activation connection as soon as said number of successively following given levels of said first internal clock signal has reached a predetermined value.

2. The memory according to claim 1, including a variable control signal connection carrying a variable control signal for setting said predetermined value of said number of successively following given levels of said first internal clock signal, said variable control signal connection connected to said counting unit for supplying said variable control signal to said counting unit.

3. The memory according to claim 2, wherein:
   said counting unit has a shift register with a series circuit of register elements;
   each of said register elements has at least two inputs and at least one output;
   one of said at least two inputs of a first of said register elements is connected to said output control connection for supplying said first register element with said output control signal at said one input;
   another of said at least two inputs of said first register element is connected to said clock generator for clocking said first register element with said second internal clock signal at said another input;
   others of said register elements are clocked as a function of said first internal clock signal;
   a multiplexer has a switching state, inputs, and an output;
   said inputs of said multiplexer are connected to said at least one output of some of said register elements;
   said output of said multiplexer is connected to said activation connection for connecting said at least one output of at least one of said register elements to said activation connection; and
   said switching state of said multiplexer is set by said variable control signal.

4. The memory according to claim 1, wherein said clock generator has a delay element and produces said second internal clock signal from said first internal clock signal with said delay element.

5. The memory according to claim 4, wherein said control unit has:
   a variable delay unit with a variable delay unit input, a variable delay unit output, and a variable delay unit control input;
   a control unit input connected to the external clock;
   a control unit output connected to said control unit input through said variable delay unit, said control unit output outputting said first internal clock signal;
   a phase comparator with:
      a first comparator input connected to said control unit input;
      a second comparator input connected to said control unit output through said delay element of said clock generator; and
      a comparator output connected to said variable delay unit control input.

* * * * *